United States Patent
Linderman

(10) Patent No.: US 9,246,037 B2
(45) Date of Patent: Jan. 26, 2016

(54) FOLDED FIN HEAT SINK

(75) Inventor: Ryan Linderman, Oakland, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 1454 days.

(21) Appl. No.: 12/960,039

(22) Filed: Dec. 3, 2010

(65) Prior Publication Data

US 2012/0138283 A1 Jun. 7, 2012

(51) Int. Cl.
*F28F 7/00* (2006.01)
*H01L 31/052* (2014.01)
*F28F 3/02* (2006.01)

(52) U.S. Cl.
CPC .............. *H01L 31/052* (2013.01); *F28F 3/025* (2013.01); *Y02E 10/50* (2013.01)

(58) Field of Classification Search
CPC ......... H01L 31/052; F28F 3/025; Y02E 10/50
USPC ....................................................... 165/185
See application file for complete search history.

(56) References Cited

U.S. PATENT DOCUMENTS

| | | |
|---|---|---|
| 4,153,474 A | 5/1979 | Rex |
| 4,323,719 A | 4/1982 | Green |
| 4,373,783 A | 2/1983 | Anderson |
| 4,456,332 A | 6/1984 | Anderson |
| 4,468,848 A | 9/1984 | Anderson et al. |
| 4,468,849 A | 9/1984 | Anderson et al. |
| 4,481,378 A | 11/1984 | Lesk |
| 4,502,200 A | 3/1985 | Anderson et al. |
| 4,640,734 A | 2/1987 | Roberts et al. |
| 4,643,543 A | 2/1987 | Mohn et al. |
| 4,643,544 A | 2/1987 | Loughran |
| 4,759,803 A | 7/1988 | Cohen |
| 5,180,441 A | 1/1993 | Cornwall et al. |
| 5,248,346 A | 9/1993 | Fraas et al. |
| 5,334,496 A | 8/1994 | Pond et al. |
| 5,344,496 A | 9/1994 | Stern et al. |
| 5,389,158 A | 2/1995 | Fraas et al. |
| 5,409,549 A | 4/1995 | Mori |
| 5,498,297 A | 3/1996 | O'Neill et al. |
| 5,580,395 A | 12/1996 | Yoshioka et al. |
| 5,616,185 A | 4/1997 | Kukulka |
| 5,660,644 A | 8/1997 | Clemens |

(Continued)

FOREIGN PATENT DOCUMENTS

DE     10041271     3/2002
DE     202004005198  8/2004

(Continued)

OTHER PUBLICATIONS

Bardwell, Karen et al., "Minimizing End Shadowing Effects on Parabolic Concentrator Arrays," IEEE, 1980, pp. 765-770.

(Continued)

*Primary Examiner* — Ljiljana Ciric
(74) *Attorney, Agent, or Firm* — Knobbe Martens Olson & Bear, LLP

(57) ABSTRACT

A heat sink can include a folded fin with a base portion, an offset portion extending away from the base portion, the offset portion having a width, a narrowing tapering portion having a maximum width equal to the width of the offset portion, and an extension portion extending away from the narrowing tapering portion, the extension portion having a width smaller than the width of the offset portion.

20 Claims, 3 Drawing Sheets

(56) References Cited

U.S. PATENT DOCUMENTS

| | | | |
|---|---|---|---|
| 5,697,192 A | 12/1997 | Inoue | |
| 5,791,406 A * | 8/1998 | Gonner et al. | 165/185 |
| 5,865,905 A | 2/1999 | Clemens | |
| 5,899,199 A | 5/1999 | Mills | |
| 5,990,415 A | 11/1999 | Green et al. | |
| 6,000,462 A * | 12/1999 | Gonner | 165/80.3 |
| 6,034,322 A | 3/2000 | Pollard | |
| 6,131,565 A | 10/2000 | Mills | |
| 6,323,478 B1 | 11/2001 | Fujisaki et al. | |
| 6,359,209 B1 | 3/2002 | Glenn et al. | |
| 6,442,937 B1 | 9/2002 | Stone | |
| 6,553,729 B1 | 4/2003 | Nath et al. | |
| 6,635,507 B1 | 10/2003 | Boutros et al. | |
| 7,468,485 B1 | 12/2008 | Swanson | |
| 7,554,031 B2 | 6/2009 | Swanson et al. | |
| 7,709,730 B2 | 5/2010 | Johnson et al. | |
| 7,820,906 B2 | 10/2010 | Johnson et al. | |
| 7,825,327 B2 | 11/2010 | Johnson et al. | |
| 7,932,461 B2 | 4/2011 | Johnson et al. | |
| 7,952,057 B2 | 5/2011 | Finot et al. | |
| 7,968,791 B2 | 6/2011 | Do et al. | |
| 8,039,777 B2 | 10/2011 | Lance et al. | |
| 8,049,150 B2 | 11/2011 | Johnson et al. | |
| 8,071,930 B2 | 12/2011 | Wylie et al. | |
| 8,083,362 B2 | 12/2011 | Finot et al. | |
| 2004/0074490 A1 | 4/2004 | Mills et al. | |
| 2007/0151598 A1 | 7/2007 | De Ceuster et al. | |
| 2007/0257274 A1 | 11/2007 | Martter et al. | |
| 2008/0035198 A1 | 2/2008 | Teppe et al. | |
| 2009/0056699 A1 | 3/2009 | Mills et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0095284 A1 | 4/2009 | Klotz | |
| 2009/0139557 A1 | 6/2009 | Rose et al. | |
| 2010/0154788 A1 | 6/2010 | Wells et al. | |
| 2010/0163014 A1 | 7/2010 | Johnson et al. | |
| 2010/0175740 A1 | 7/2010 | Johnson et al. | |
| 2010/0193014 A1 | 8/2010 | Johnson et al. | |
| 2010/0236626 A1 | 9/2010 | Finot et al. | |
| 2010/0294336 A1 | 11/2010 | Johnson et al. | |
| 2010/0319682 A1 | 12/2010 | Klotz | |
| 2011/0023940 A1 | 2/2011 | Do et al. | |
| 2011/0132457 A1 | 6/2011 | Finot | |
| 2011/0186130 A1 | 8/2011 | Finot et al. | |
| 2011/0226309 A1 | 9/2011 | Do et al. | |
| 2011/0226310 A1 | 9/2011 | Johnson et al. | |
| 2011/0265869 A1 | 11/2011 | Finot et al. | |

FOREIGN PATENT DOCUMENTS

| | | |
|---|---|---|
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |

OTHER PUBLICATIONS

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE , vol., no., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

* cited by examiner

FOLDED FIN HEAT SINK

TECHNICAL FIELD

Embodiments of the subject matter described herein relate generally to heat sinks. More particularly, embodiments of the subject matter relate to folded fin heat sinks.

BACKGROUND

Receivers for solar concentrators are the focus for light which has intensity greater than sunlight. Some concentrators produce an intensity equivalent to two or three multiples of the intensity of sunlight, while other concentrators can produce light forty or fifty times as intense as sunlight. The focused light can be directed toward a receiver, which can be a thermal conversion device, such as a working fluid conduit or a Stirling engine, a photovoltaic cell, or a combination of the thermal conversion device with a photovoltaic cell.

For applications which direct concentrated sunlight on a photovoltaic cell, some heat is produced by the focused light impinging on the cell. As the heat experienced by the photovoltaic cell increases, its conversion efficiency decreases. Accordingly, it is desirable to conduct heat away from the photovoltaic cell.

One technique for conducting heat away from the photovoltaic cell is to thermally couple the cell to a heat sink. The shape and composition of the heat sink can determine its effectiveness at conducting heat away from the photovoltaic cell and consequently affect the efficiency of the cell.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 3:
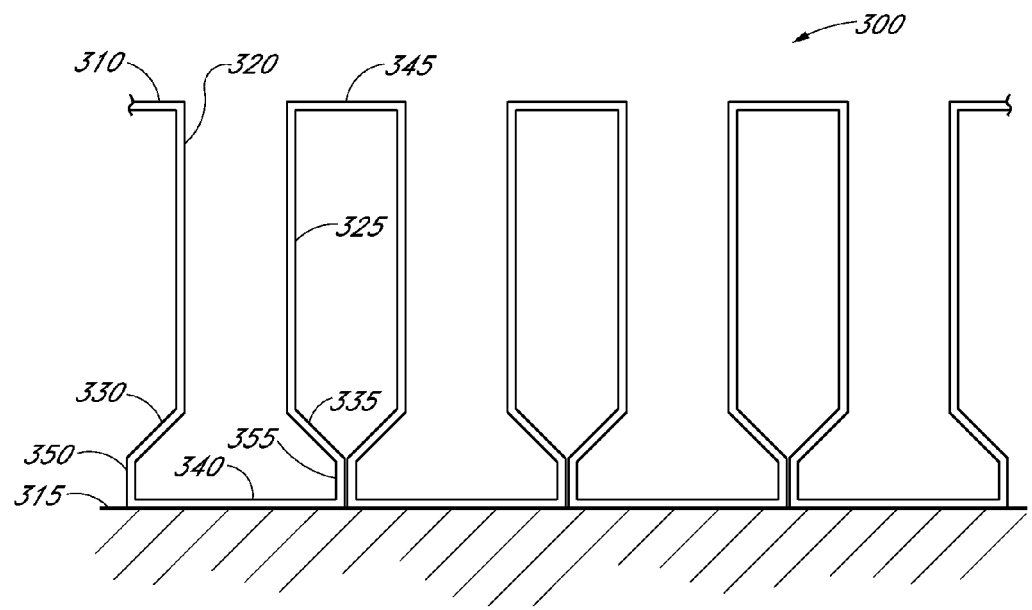
FIG. 3 is a cross-sectional view of a portion of an embodiment of a folded fin heat sink.

"Coupled"—The following description refers to elements or nodes or features being "coupled" together. As used herein, unless expressly stated otherwise, "coupled" means that one element/node/feature is directly or indirectly joined to, connected to, or in thermal contact with (or directly or indirectly communicates with) another element/node/feature, and not necessarily mechanically. Thus, although the schematic shown in FIG. 3 depicts one exemplary arrangement of elements, additional intervening elements, devices, features, or components may be present in an embodiment of the depicted subject matter, including thermal coupling.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "upward" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

In one embodiment, a heat sink comprising a folded fin is disclosed. The folded fin comprises a base portion, an offset portion extending away from the base portion, the offset portion having a width, a narrowing tapering portion having a maximum width equal to the width of the offset portion, and an extension portion extending away from the narrowing tapering portion, the extension portion having a width smaller than the width of the offset portion.

In another embodiment, a folded fin heat sink having a repeating shape is disclosed. Each instance of the repeating shape has a base portion, a first pair of offset walls extending from the base portion, a tapering pair of walls extending from the first pair of offset walls, a second pair of offset walls extending from the tapering pair of walls, and a pair of bridging portions, each bridging portion connecting one of the second pair of offset walls to an adjacent instance of the repeating shape.

In another embodiment, a heat sink comprising a folded fin is disclosed. The folded fin comprises a base portion, an offset portion extending away from the base portion, the offset portion having a width, and an extension portion connected to the offset portion, the extension portion having a width smaller than the width of the offset portion.

Figure 1:
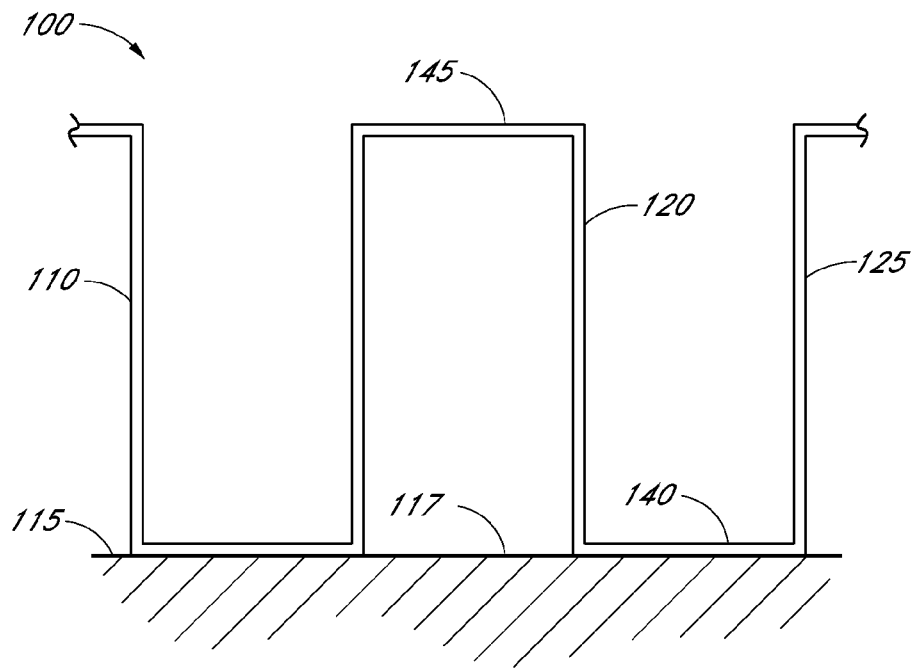
FIG. 1 is a cross-sectional view of a heat sink.

FIG. 1 illustrates a folded fin heat sink design which is known in the prior art. Such a design or one having similar features can be used when thermally coupling to a photovoltaic cell in a receiver for a solar concentrator. Specifically, a heat sink arrangement 100 is shown with a heat sink 110 coupled to a photovoltaic cell 115. The photovoltaic cell 115 represented can be enclosed in a laminate and, accordingly, the surface shown contacting the heat sink 110 can be a backsheet, or heat spreader coupled to a backsheet, or similar arrangement. Thus, although designated as a photovoltaic cell, as used throughout, the heat sinks shown and described can be coupled to one or more intermediary components and/or thermal pastes, which are thermally coupled to a photovoltaic cell receiving solar radiation.

The heat sink 110 is of a folded fin design. A folded fin is a shaped plane of material, as opposed to an extruded heat sink. The plane of material, typically a metal, is bent to form a desired cross-section shape, typically a repeated shape.

In the illustrated example of FIG. 1, the heat sink has a shape similar to a square waveform. A single example of the repeated shape of FIG. 1 has a first horizontal plane 145 which extends parallel to the surface of the photovoltaic cell 115. A first vertical wall 120 is connected to the first horizontal plane 145 and extends perpendicular to the surface of the photovoltaic cell 115. As base plane 140 extends along the surface of the photovoltaic cell 115 and is coupled to the first vertical wall 120 and a second vertical wall 125. The second vertical wall 125 extends perpendicularly away from the surface of the photovoltaic cell 115 and the base plane 140 to complete the waveform shape. As can be seen, the shape can repeat as many times as desired to extend the length of the heat sink 110.

As with all heat sink arrangements described herein, the heat sink 110 is surrounded by ambient air which may or may not be directed across or through the heat sink 110. By conducting heat away from the photovoltaic cell 115 through the base plane 140 to portions of itself which are surrounded by ambient air, the heat sink 110 permits an increased amount of heat to be transferred away from the photovoltaic cell 115 as compared to exposing the surface of the photovoltaic cell 115 without a heat sink.

Typically, the width of the base plane 140 and first horizontal plane 145 are equal, resulting in an equal amounts of the surface of the photovoltaic cell 115 which contacts the base plane 140 and exposed surface portions of the photovoltaic cell 115 which are not in direct contact with the heat sink 110. One such region is illustrated as portion 117, which is between adjacent vertical walls and below the first horizontal plane 145. One disadvantageous effect of this design is that the exposed portion 117 is not cooled through contact with the heat sink 110, but rather by ambient convection, which is inferior to cooling by thermal coupling with the heat sink 110.

As a result, another disadvantageous effect is that heat must travel laterally within the photovoltaic cell 115 prior to transference to the heat sink 110. Heat transferred laterally through the photovoltaic cell 115 to a nearby base plane 140 can travel up to half the distance between the first and second vertical walls 120, 125. For example, heat generated in the middle of the exposed portion 117 is transferred through the photovoltaic cell 115 toward the first vertical wall 120 until reaching the base plane 140. This lateral heat transfer is also detrimental to the conversion efficiency of the photovoltaic cell 115.

Figure 2:
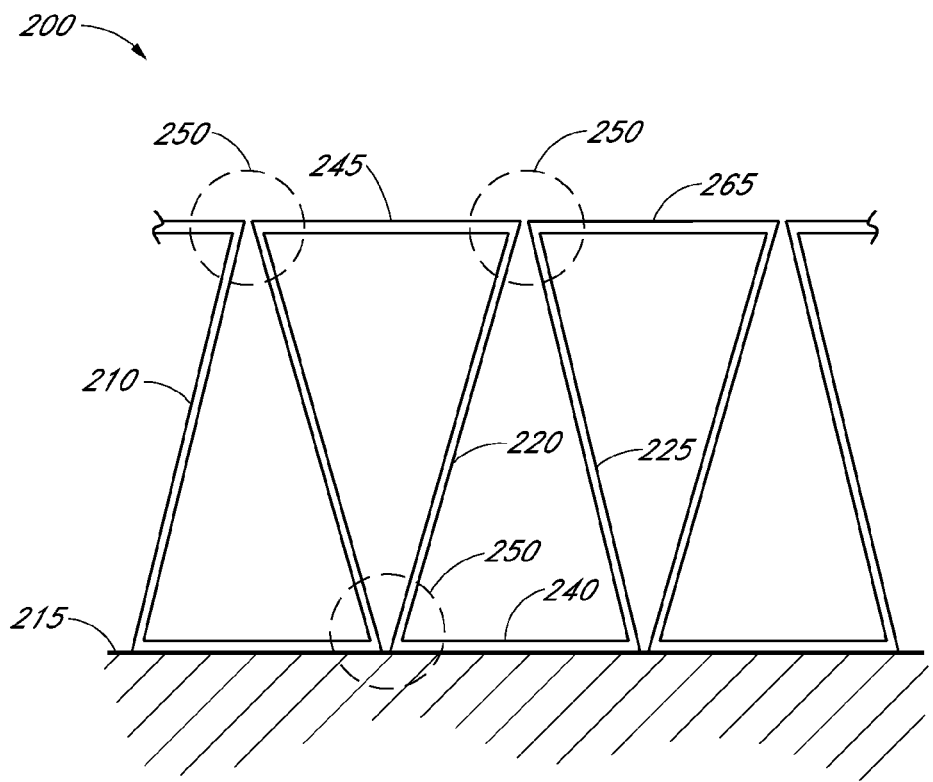
FIG. 2 is a cross-sectional view of another heat sink.

FIG. 2 is another heat sink arrangement 200. Unless otherwise described, the numerical indicators shown in FIG. 2 are substantially the same as those for FIG. 1, except that they have been incremented by 100.

The heat sink 210 has a triangular cross-section shape. Thus, the first and second vertical walls 220, 225 are inclined at an angle. The base plan 240, however, has a greater width, extending beneath adjacent horizontal planes 245, 265. Because the width is relatively greater when compared to heat sink 100 of FIG. 1, more of the surface of the photovoltaic cell 215 is in contact with the heat sink 210, permitting greater heat transfer through the heat sink 210.

Heat sink 210 has a geometry which results in constricted airflow. Dashed lines 250 indicate regions of the heat sink 210 where walls of the heat sink 210 approach in close proximity, inhibiting flow of the ambient air evenly over all surfaces of the heat sink 210. By inhibiting the flow of ambient air, the close proximity of walls of the heat sink influences the amount of heat which can be transferred to the ambient air by convection from the surface of the heat sink 210. This has a corresponding effect on the temperature of the photovoltaic cell 215 and consequential detrimental effect to the conversion efficiency of the photovoltaic cell 215.

FIG. 3 illustrates an embodiment of a heat sink arrangement 300. The heat sink 310 is coupled to a photovoltaic cell 315. The heat sink 310 is a folded fin heat sink, preferably composed of a metal. The heat sink 310 preferably has a repeating shape when viewed in cross-section. The cross-section of the heat sink 310 can have a base portion 340, first and second offset portions 350, 355, first and second tapering walls 330, 335, and first and second vertical walls 320, 325. Each repeating shape includes a bridging portion 345 which connects the first and second vertical walls 320, 325.

Figure 4:
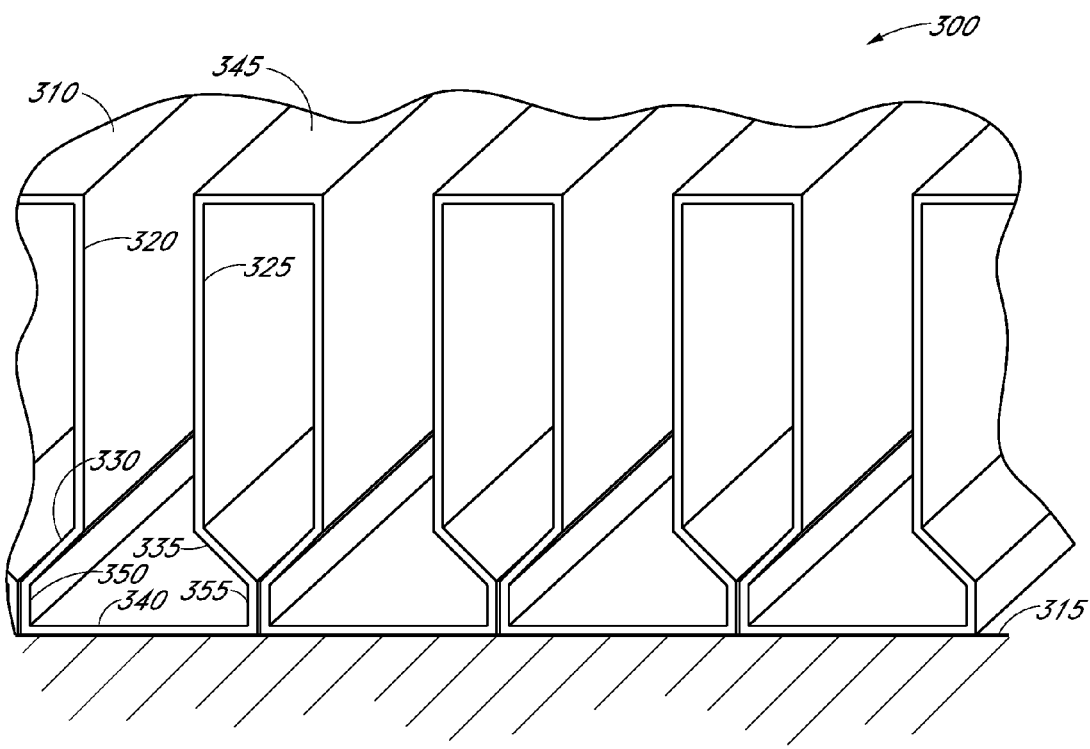
FIG. 4 is a perspective view of the portion of the embodiment of FIG. 3.

The heat sink 310 is shown in perspective in FIG. 4. The base portion 340 comprises a substantially planar portion of the folded fin heat sink 310 which contacts the photovoltaic cell 315. As explained above, the contact interface can be directly to a photovoltaic cell 315, to a laminate, to an electrically-insulated intermediate component, or otherwise indirectly, but thermally connected to a photovoltaic cell as part of a solar concentrator receiver. A paste or adhesive or other thermal interface improvement can also be present between the base portion 340 and the photovoltaic cell 315.

The first and second offset portions 350, 355 are portions of the folded fin which extend upwards away from the photovoltaic cell 315. The first and second offset portions 350, 355 preferably extend in a direction substantially perpendicular to the surface of the photovoltaic cell 315. Although shown formed at right angles to the base portion 340, small angular variation is also contemplated to accommodate manufacturing techniques. Such angular variation can include one or more embodiments in which at least one of the offset portions 350, 355 forms an acute angle with the base portion 340.

The first and second offset portions 350, 355 connect to first and second tapering portions or walls 330, 335, respectively. Each of the narrowing tapering walls 330, 335 preferably narrows the shape or width of the repeating shape of the heat sink 310 by angling toward one another. The width referred to is a measure of distance between similar and adjacent portions of the repeating shape of the folded fin heat sink 310. Thus, the first and second vertical walls 320, 325 have an interior width between their interior surfaces, and an exterior width which includes the thickness of the sheet material of the folded fin. As used throughout, the width between members of the repeating shape of the folded fin heat sink refers to any measure of width at a point along the member, so long as it is used consistently when comparing to another member. Thus, a comparison of the width of the vertical walls 320, 325 to the offset portions 350, 355 can refer to the interior width of the vertical walls 320, 325 as compared to the interior width of the offset portions 350, 355, or the exterior width compared between the two, or a width between central points in the thickness of the heat sink wall, so long as the comparison is between consistent portions.

Thus, the base portion 340 has a first width and the vertical walls 320, 325 have a second width where the first width is greater than the second width. The transition between the first and second widths occurs at the tapering walls 330, 335. The angle formed from the direction perpendicular to the surface of the photovoltaic cell 315 (the "vertical" direction) by each of the tapering walls 330, 335 can be approximately 45°. Thus, the angle formed by each of the tapering walls 330, 335 relative to its connecting offset portion 350, 355 can be approximately 135°, as measured along the interior of the shape. The first and second tapering walls 330, 335 preferably extend toward each other until returning to a substantially parallel shape, extending in the vertical direction.

The first and second vertical walls 320, 325 extend further in the vertical direction after the narrowing feature of the tapering walls 330, 335. The first and second vertical walls 320, 325 comprise the remainder of the height to the bridging portion 345 after the tapering walls 330, 335. The bridging portion 345 preferably extends between adjacent vertical walls 320, 325 to one side only, as formed by the folding technique that creates the folded fin. In some embodiments, the bridging portion 345 can provide structural support as well as an additional transferring surface for dispersing heat to the ambient air.

In some embodiments, the bridging portion 345 can be understood to be extending evenly in either direction away from the first and second vertical walls 320, 325, thereby connecting with similar bridging portions of neighboring shapes. Relative to the bridging portion 345, both the offset portions 350, 355 and vertical walls 320, 325 can be considered offsetting portions as they increase the distance between the bridging portion 345 (or portions) and the base portion 340 or surface of the photovoltaic cell 315.

Preferably there is a small space between adjacent offset portions of neighboring shapes in the heat sink 310. The space between offset portions and, correspondingly base portions, permits for thermal expansion of the heat sink without substantial deformation to the cross-sectional shape of the heat sink. Preferably the space between adjacent shapes is 2 mm or less, and as small as possible once the heat sink 310 experiences maximum thermal expansion.

The heat sink 310 is preferably made from a metal having excellent thermal conductive properties, such as gold, silver, copper, aluminum, or similar metals. When used herein, a metal refers to an elemental form, or compounds or alloys thereof.

Figure 5:
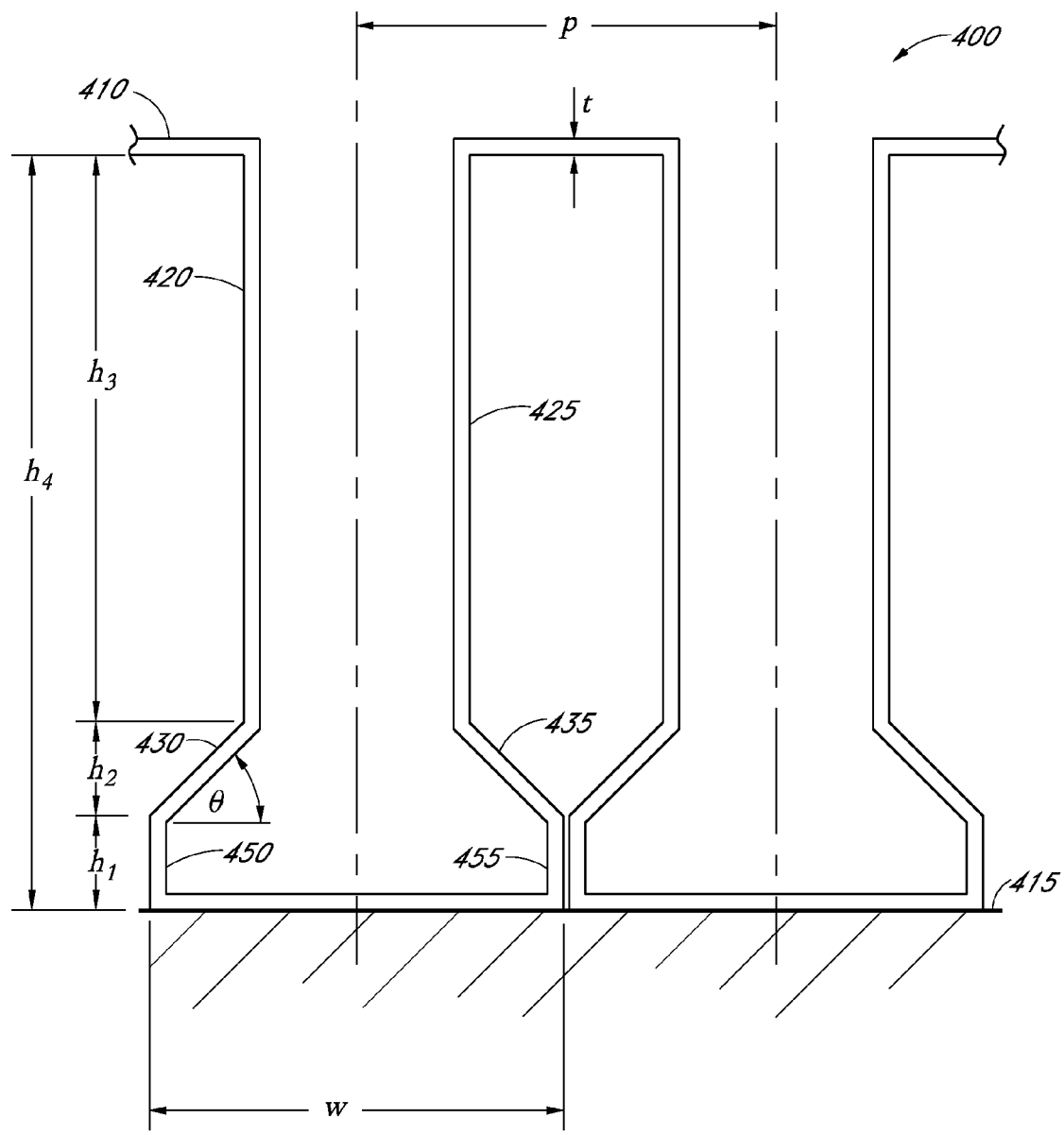
FIG. 5 is detailed view of features of an embodiment of a folded fin heat sink.

FIG. 5 describes many of the features of the heat sink 310 of FIGS. 3 and 4, with reference made to designators to express dimensional values. Many of the features of FIGS. 3 and 4 are present in the embodiment shown in FIG. 5, however, and reference is made to numerical indicators that are similar to those for the numerical indicators of FIGS. 3 and 4 except that the number has been incremented by 100. Although certain dimensional values are used throughout, they are only approximate or preferable embodiments and can be increased or decreased to maintain approximately the shape of the heat sink 310 without deviating from the contemplated embodiments disclosed herein.

Thus, width w refers to the approximate width of the base portion 440 as measured from outside edges as approximately 14 mm, although it can be larger, such as 16 or 20 mm, or smaller, such as 12 mm, 11 mm, 10 mm, or less, as appropriate to the scale of the embodiment. Similarly, in one embodiment, thickness t of the wall of the folded fin heat sink 410 is approximately 0.5 mm, although smaller and larger thicknesses can be used.

Heights as described herein are measured as extending away from the surface of the photovoltaic cell 415. Height $h_1$ refers to the approximate height of the offset portions 450, 455 and can be, in one embodiment, about 2.5 mm. It can also be 1 mm, 3 mm, 4 mm, 5 mm, or any other height appropriate to the scale of the embodiment. Height $h_2$ refers to the approximate height of the tapering walls 430, 435, and can be in one embodiment 2.5 mm, although larger or smaller heights can be used. Angle θ refers to the angle formed by the tapering walls 430, 435 to a direction parallel to the surface of the photovoltaic cell 415, and is approximately 45°, although smaller or larger values can be used, preferably in a range between 30° and 60°. Consequently, the angle formed between the tapering walls 430, 435 and the vertical direction is also approximately 45°, although it is complementary to angle θ, and can be larger or smaller accordingly.

Height $h_3$ refers to approximately the height of the vertical walls 420, 425, and can be, in one embodiment, about 35 mm, although other embodiments can have larger or smaller sizes, as desired. The overall height of the heat sink 410 is $h_4$, which in one embodiment can be approximately 40 mm. The over height $h_4$ can be increased or decreased as desired, in conjunction with other dimensions to embody the features described herein.

Pitch p is approximately the size of the overall shape of the repeated pattern in the heat sink 410 and refers to the distance between similar elements in adjacent shapes. In one embodiment, the pitch p can be approximately 14 mm, though the pitch p can be greater or smaller as desired for an embodiment.

One advantageous feature of heat sink 310 as compared to heat sink 110 is that the base portions 340 of the heat sink 310 contact substantially entirely the surface of the photovoltaic cell 315. Additionally, the offset portions 350, 355 advantageously permit increased ambient airflow as compared to the constricted regions illustrated by dashed lines 250 in FIG. 2. The increased airflow permits improved heat transfer by the heat sink 310 which in turn can reduce the operating temperature of the photovoltaic cell 315, thereby increasing its conversion efficiency. By decreasing the operating temperature of the photovoltaic cell 315 by 3° C., its conversion efficiency can be improved by as much as 1.2%, depending on the concentration ratio of sunlight impinging on the photovoltaic cell 315.

One advantageous feature of the tapering walls 330, 335 is that the vertical walls 320, 325 are approximately evenly spaced apart from one another, permitting both optimal ambient air flow therebetween as well as optimal heat transfer from the vertical walls 320, 325 to the ambient air.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A heat sink comprising a folded fin, the folded fin comprising:
    a flat base portion extending along a base direction;
    an offset portion extending away from the base portion along an offset direction that is transverse to the base direction, the offset portion having a width defined along the base direction;
    a narrowing tapering portion extending along a tapering direction that is transverse to both the base direction and the offset direction, the narrowing tapering portion having a maximum width defined along the base direction equal to the width of the offset portion; and
    an extension portion extending away from the narrowing tapering portion and extending along an extension direction that is parallel to the offset direction, the extension portion having a width defined along the base direction that is smaller than the width of the offset portion.

2. The heat sink of claim 1, wherein the folded fin has a thickness of approximately 0.5 mm.

3. The heat sink of claim 1, wherein the offset portion has a height of approximately 2 mm.

4. The heat sink of claim 1, wherein the narrowing taper portion has a height approximately the same as the offset portion.

5. The heat sink of claim 1, wherein the narrowing taper portion is formed at approximately a 45° angle to the offset portion.

6. The heat sink of claim 5 wherein the narrowing taper portion is formed at approximately a 45° angle to the extension portion.

7. The heat sink of claim 1, wherein the folded fin comprises copper.

8. The heat sink of claim 1, wherein the folded fin comprises aluminum.

9. A folded fin heat sink having a repeating shape, each instance of the repeating shape having:
   a base portion;
   a first pair of offset walls extending along a first direction from the base portion and parallel to each other;
   a tapering pair of walls extending from the first pair of offset walls along a tapering direction that is transverse to the first direction;
   a second pair of offset walls extending along a second direction that is transverse to the tapering direction and extending from the tapering pair of walls; and
   a pair of bridging portions, each bridging portion connecting one of the second pair of offset walls to an adjacent instance of the repeating shape.

10. The folded fin heat sink of claim 9, wherein the width of the first pair of offset walls is approximately the same as the width of the base portion.

11. The folded fin heat sink of claim 9, wherein the width of the first pair of offset walls is larger than the width of the second pair of offset walls.

12. The folded fin heat sink of claim 9, wherein the folded fin heat sink has a pair of terminating shapes surrounding the repeating shapes, the terminating shapes formed without the pair of bridging shapes.

13. The folded fin heat sink of claim 9, wherein each of the first pair of offset walls extends from the base portion at a right angle to the base portion.

14. The folded fin heat sink of claim 9, wherein each of the first pair of offset walls forms an acute angle with the base portion.

15. The folded fin heat sink of claim 9, wherein each base portion is spaced apart from each adjacent base portion.

16. A heat sink comprising a folded fin, the folded fin comprising:
   a base portion;
   an offset portion extending along an offset direction away from the base portion, the offset portion having a width; and
   an extension portion connected to the offset portion, the extension portion extending along an extension direction away from the base portion, the extension direction being parallel to and spaced from the offset direction, such that the extension portion has a width smaller than the width of the offset portion.

17. The heat sink of claim 16, wherein the offset portion has a constant width.

18. The heat sink of claim 16, wherein the extension portion has a constant width.

19. The heat sink of claim 16, further comprising a tapering portion connecting the offset portion to the extension portion, wherein the tapering portion has a changing width.

20. The heat sink of claim 16, wherein, the base portion has a width of approximately 11 mm.

* * * * *